United States Patent

Katakura

[11] Patent Number: 5,999,049
[45] Date of Patent: Dec. 7, 1999

[54] DIFFERENTIAL AMPLIFIER CIRCUIT HAVING NON-LINERITY CANCELLATION FEATURE

[75] Inventor: Masayuki Katakura, Kanagawa, Japan

[73] Assignee: Sony Corporation, Japan

[21] Appl. No.: 09/007,541

[22] Filed: Jan. 15, 1998

[30] Foreign Application Priority Data

Jan. 16, 1997 [JP] Japan ..................................... 9-005380

[51] Int. Cl.$^6$ ....................................................... H03F 3/45
[52] U.S. Cl. ........................................... 330/252; 330/254
[58] Field of Search ..................................... 330/252, 254, 330/310, 311; 327/359

[56] References Cited

U.S. PATENT DOCUMENTS

| | | | |
|---|---|---|---|
| 4,292,597 | 9/1981 | Niimura et al. | 330/254 |
| 4,820,997 | 4/1989 | Sano et al. | 330/252 |
| 4,904,952 | 2/1990 | Tanimoto | 330/252 |
| 5,821,810 | 10/1998 | Swart et al. | 330/254 |

*Primary Examiner*—Steven J. Mottola
*Attorney, Agent, or Firm*—Rader, Fishman & Grauer; Ronald P. Kananen

[57] ABSTRACT

A differential amplifier circuit comprises a first differential transistor circuit, a grounded base transistor circuit and a second differential transistor circuit. A pair of transistors of the second differential transistor each produces a current based on an emitter voltage of each of a pair of transistors of the grounded base transistor circuit for cancelling non-linear components of transistors of the first differential transistor circuit. The currents produced by the second differential transistor circuit are each cross-added to an alternating current component of each of the first differential transistor circuit at a collector of each of the pair of transistors of the grounded base transistor circuit. Non-linear components of the first differential transistor circuit are thus cancelled out.

5 Claims, 8 Drawing Sheets

DIFFERENTIAL AMPLIFIER CIRCUIT HAVING NON-LINERITY CANCELLATION FEATURE

BACKGROUND OF THE INVENTION

1. Field of the Invention

The present invention relates to a differential amplifier circuit having first and second transistors wherein an input voltage is applied between base electrodes thereof and an emitter feedback resistor is inserted between emitter electrodes thereof.

2. Description of the Related Art

FIG. 1 is schematic circuit diagram showing a differential amplifier circuit as a most basic elementary circuit of a bipolar transistor circuit. In the figure, Q1 and Q2 each indicate a transistor. I represents a current source of a current of 2Io. E is an input voltage source of a voltage 'v'.

Equation (1) below gives a relation between an input voltage v and an amount of change (an alternating current component) 'i' in a collector current Io of the transistors Q1 and Q2 in the circuit, that is, a transfer characteristic thereof.

$$i = Io*exp(v/Vt)/\{1+exp(v/VT)\} \quad (1)$$

VT represents a thermal voltage ($=kT/q$; where k is Boltzmann's constant, T is the absolute temperature, and q is a charge of an electron). The thermal voltage is approximately 26 mV at room temperature.

The circuit has a very narrow range of linearity. In order to improve the linearity, a feedback resistor R is inserted between emitter electrodes and the current source I is divided into current sources I1 and I2 as shown in FIG. 2. A transfer characteristic of the circuit is analytically insoluble. Input voltage v expressed by output current I is given by equation (2) below.

$$v = VT*1n\{(Io+i)/(Io-i)\}+2*i*RE \quad (2)$$

where RE is a resistance of feedback resistor R.

Equation (3) below is given by calculating a higher order derivative of v from equation (2) and converting the derivative into a derivative of i, utilizing a differential characteristic of an inverse function thereof.

$$i = Io[(1/2)(v/VE)$$

$$-(1/24)(VT/VE)(v/VE)^3$$

$$-(1/480)\{3-(5*VT/VE)\}$$

$$(VT/VE)(V/VE)^5] \quad (3)$$

VE is expressed by equation (4) below.

$$VE = Io*RE+VT \quad (4)$$

(VE/VT) represents a reduction rate of a gain of feedback resistor R. Equation (4) indicates that a dynamic range widens roughly in proportion to an increase in (VE/VT).

FIG. 3 shows differential gains of input voltage v normalized by 2*VE when (VE/VT)=3, 5 and 10. A degree of linearity required greatly depends on application areas. When (VE/VT)=10, a differential gain changes by as much as 1 percent with a signal amplitude of half of 2*VE.

When a very high degree of linearity is required, however, too much increase in (VE/VT) causes problems. The problems are mainly: a reduction in gain; an increase in signal-to-noise ratio; and an increase in direct current offset voltage.

A typical application where a high degree of linearity and a low noise are required is, for example, a first amplification stage of a radio communication circuit. In such an application a trade-off between a noise characteristic and linearity has been sought or a large current has been required for improving a noise characteristic.

SUMMARY OF THE INVENTION

It is an objective of the invention to provide a differential amplifier circuit in a first amplification stage of a radio communication circuit, a mixer circuit and a gain control circuit and so on, for improving linearity of a transfer characteristic without sacrificing a noise characteristic, a gain and a current consumption and so on.

A differential amplifier circuit of the invention comprises: a first differential transistor circuit having first and second transistors wherein an input voltage is applied between base electrodes of the first and second transistors and an emitter feedback resistor is inserted between emitter electrodes of the first and second transistors; a common base transistor circuit having third and fourth transistors wherein a collector current of each of the first and second transistors is supplied to an emitter electrode of each of the third and fourth transistors, respectively; and a second differential transistor circuit having fifth and sixth transistors wherein an emitter electrode voltage of each of the third and fourth transistors is supplied to a base electrode of each of the fifth and sixth transistors and a collector current of each of the fifth and sixth transistors is cross-added to a collector current of each of the fourth and third transistors, respectively.

Another differential amplifier circuit of the invention comprises: a first differential transistor circuit having first and second transistors wherein an input voltage is applied between base electrodes of the first and second transistors and an emitter feedback resistor is inserted between emitter electrodes of the first and second transistors; a first common base transistor circuit having third and fourth transistors wherein a collector current of each of the first and second transistors is supplied to an emitter electrode of each of the third and fourth transistors, respectively; a second differential transistor circuit having fifth and sixth transistors wherein an emitter electrode voltage of each of the third and fourth transistors is supplied to a base electrode of each of the fifth and sixth transistors and an emitter feedback resistor is inserted between emitter electrodes of the fifth and sixth transistors; a second common base transistor circuit having seventh and eighth transistors wherein a collector current of each of the fifth and sixth transistors is supplied to an emitter electrode of each of the seventh and eighth transistors and a collector electrode of each of the seventh and eighth transistors is cross-connected to a collector electrode of each of the fourth and third transistors; and a third differential transistor circuit having ninth and tenth transistors wherein an emitter electrode voltage of each of the seventh and eighth transistors is supplied to a base electrode of each of the ninth and tenth transistors and a collector electrode of each of the ninth and tenth transistors is cross-connected to a collector electrode of each of the eighth and seventh transistors.

Still another differential amplifier circuit of the invention comprises: a first differential transistor circuit having first and second transistors wherein a first input voltage is applied between base electrodes of the first and second transistors and an emitter feedback resistor is inserted between emitter electrodes of the first and second transistors; a second differential transistor circuit having third and fourth transistors; a third differential transistor circuit having fifth and sixth transistors wherein a second input voltage is applied between base electrodes of the fifth and sixth transistors and a collector of each of the fifth and sixth transistors is connected to a collector of the first transistor; a fourth differential transistor circuit having seventh and eighth transistors wherein the second input voltage is applied between base electrodes of the seventh and eighth transistors and a collector of each of the seventh and eighth transistors is connected to a collector of the second transistor; a fifth differential transistor circuit having ninth and tenth transistors wherein the second input voltage is applied between base electrodes of the ninth and tenth transistors and a collector of each of the ninth and tenth transistors is connected to a collector of the third transistor; and a sixth differential transistor circuit having eleventh and twelfth transistors wherein the second input voltage is applied between base electrodes of the eleventh and twelfth transistors and a collector of each of the eleventh and twelfth transistors is connected to a collector of the fourth transistor; wherein an output of a product of the first and second input voltages is obtained from the collectors of the fifth to twelfth transistors.

In the differential amplifier circuit, the fifth and sixth transistors each produce a current for cancelling non-linear components of the second and first transistors, respectively. The currents produced are each cross-added to a collector current of each of the fourth and third transistors. As a result, non-linear components of the second and first transistors are cancelled out.

In the other differential amplifier circuit, the first common base transistor circuit and the second differential transistor circuit cancel out non-linear components produced at the first transistor. In a similar manner, the second grounded base transistor circuit and the third differential transistor circuit cancel out non-linear components produced at the first transistor.

In yet another differential amplifier circuit, the differential transistor circuit is provided for dividing a current, instead of the grounded base transistor circuit. A multiplier circuit is thus formed for obtaining a product of the first and second input voltages.

DETAILED DESCRIPTION OF THE PREFERRED EMBODIMENTS

Preferred embodiments of the present invention will now be described in detail with reference to the accompanying drawings.

Figure 4:
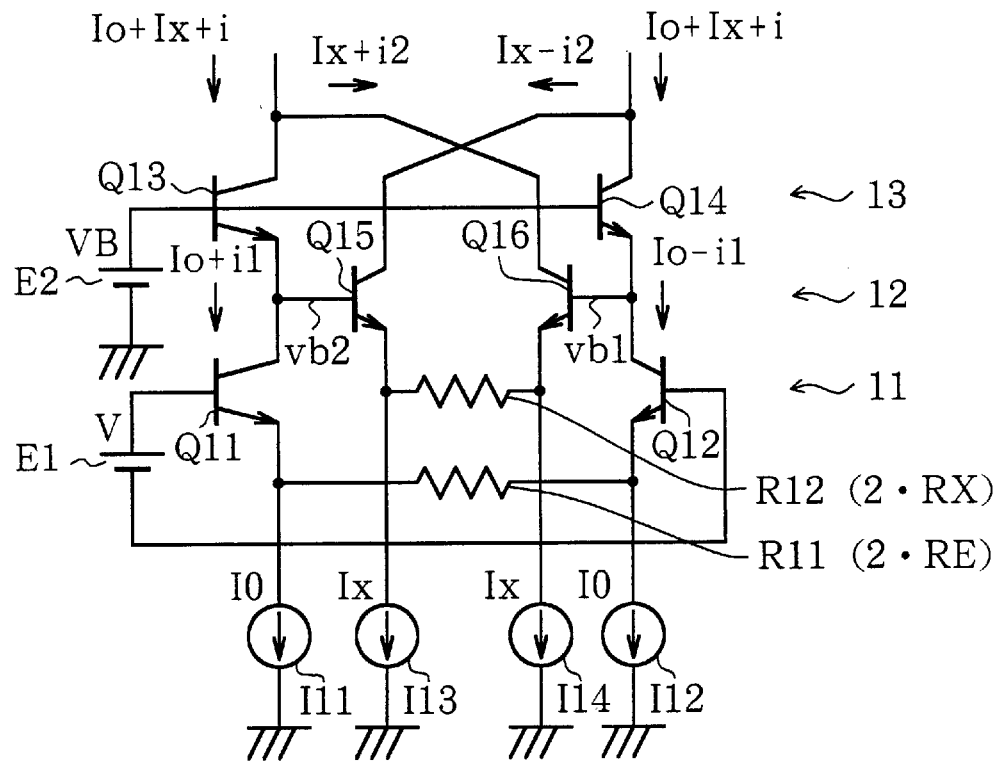
FIG. 4 is a schematic circuit diagram of a differential amplifier circuit of a first embodiment of the invention.

FIG. 4 is a schematic circuit diagram of a differential amplifier circuit of a first embodiment of the invention.

The differential amplifier circuit shown in the figure comprises a first differential transistor circuit 11, a common base transistor circuit 12 and a second differential transistor circuit 13.

The first differential transistor circuit 11 comprises transistors Q11 and Q12, emitter feedback resistor R11, constant-current power supplies I11 and I12 and an input voltage power supply E1. The grounded base transistor circuit 12 comprises transistors Q13 and Q14 and a constant-voltage power supply E2. The second differential transistor circuit 13 comprises fifth and sixth transistors Q15 and Q16 and constant-current power supplies I13 and I14.

The input voltage power supply E1 supplies an input voltage v between base electrodes of the transistors Q11 and Q12. Emitters of the transistors Q11 and Q12 are each connected to the constant-current power supplies I11 and I12, respectively. Io represents a current fed by the constant-current power supplies I11 and I12. The emitter feedback resistor R11 is connected between the emitter electrodes of the transistors Q11 and Q12. 2RE represents a resistance of the emitter feedback resistor R11.

Emitter electrodes of the transistors Q13 and Q14 of the grounded base transistor circuit 12 are each connected to collector electrodes of the transistors Q11 and Q12, respectively. Base electrodes of the transistors Q13 and Q14 are connected to the constant-voltage power supply E2.

Base electrodes of the transistors Q15 and Q16 of the second differential transistor circuit 13 are each connected to the emitter electrodes of the transistors Q13 and Q14, respectively. Emitter electrodes of the transistors Q15 and Q16 are each connected to the constant-current power supplies I13 and I14, respectively. Collector electrodes of the transistors Q15 and Q16 are each cross-connected to collector electrodes of the transistors Q14 and Q13, respectively. Ix represents a current fed by the constant-current power supplies I13 and I14. Emitter feedback resistor R12 is connected between the emitter electrodes of the transistors Q15 and Q16. 2RX represents a resistance of the emitter feedback resistor R12.

An operation of the circuit with the configuration described so far will now be described. The transistors Q15 and Q16 of the second differential transistor circuit 13 produce a current i2 each based on emitter potentials vb2 and vb1 of the transistors Q13 and Q14 of the grounded base transistor circuit 12. The current i2 cancels out non-linear components of the transistors Q12 and Q11 of the first differential transistor circuit 11.

The current i2 produced at each of the transistors Q15 and Q16 is added to alternating current component i1 of the transistors Q12 and Q11 at the collectors of the transistors Q13 and Q14, respectively. Consequently, non-linear components of the transistors Q12 and Q11 are cancelled out. As a result, linearity of a transfer characteristic of the differential amplifier circuit is improved. A higher degree of linearity is thus achieved.

The operation described above will now be described in detail. Equation (5) below expresses differential voltage vb of emitter potentials vb2 and vb1 of the transistors Q13 and Q14 of the grounded base transistor circuit 12.

$$vb = vb1 - vb2 \qquad (5)$$
$$= VT * \ln\{(Io + i1)/(Io - i1)\}$$

The differential voltage vb is a term of equation (2) shown above. Equation (2) is expressed by equation (6) below, putting the term as $\Delta vbe(i1)$.

$$v = 2*i1*RE + \Delta vbe(i1) \qquad (6)$$

Equation (6) is further expressed by equation (7) below in terms of i1.

$$i1 = \{v - \Delta vbe(i1)\}/2*RE \qquad (7)$$

An action of the second differential transistor circuit 13 will now be described. The second differential transistor circuit 13 converts $\Delta vbe(i1)$ into current i2 to be added to current i1. Therefore current i is expressed by equation (8) below.

$$i = i1 + i2$$
$$= \{(v - \Delta vbe(i1))/2*RE\}$$
$$+ \Delta vbe(i1)*Gm \qquad (8)$$

First an analysis is carried out, regarding a transfer conductance of the second differential transistor circuit 13 as an absolutely linear value Gm. In equation (8), if Gm=1/(2*RE), i=v/(2*RE). Therefore in this case the transfer characteristic is absolutely linear. An ideal characteristic is thus achieved.

As described so far, an absolutely linear transfer characteristic would be obtained if the second differential transistor circuit 13 were an ideal circuit.

However, the transfer characteristic of the second differential transistor circuit 13 practice includes non-linearity. Considerations must be given to the effect of the non-linearity as well as other factors affecting the characteristic produced by addition of the second differential transistor circuit 13, such as a noise characteristic and a direct current offset characteristic.

Effects of those factors are reduced if the transfer characteristic of the second differential transistor circuit 13 is lower and current Ix of the constant-current power supplies I3 and I4 is lower. In practice, however, the transfer characteristic is determined by a condition for cancellation of non-linear components of the transistors Q11 and Q12. If current Ix is low, linearity of the transfer conductance is affected.

A transfer conductance of the first and second differential transistor circuits 11 and 13 is Gm1 and Gm2, respectively, under the condition for cancellation of non-linear components of the transistors Q11 and Q12. The relation of Gm1 and Gm2 will be given below.

Transfer conductances Gm1 and Gm2 of the first and second differential transistor circuits 11 and 13 are each expressed by equations (9) and (10), respectively.

$$Gm1 = 1/\{2(RE + VT/Io)\} \qquad (9)$$
$$Gm2 = 1/\{2(RX + VT/Ix)\} \qquad (10)$$

With the condition for cancellation of non-linear components of the transistors Q11 and Q12 given by equation (8), the relation between transfer conductances Gm1 and Gm2 of the first and second differential transistor circuits 11 and 13 is given by equation (11) below.

$$Gm2/Gm1 = 1 + [1/\{(VE/VT) - 1\}] \qquad (11)$$

It is required that transfer conductance Gm2 is always larger than transfer conductance Gm1 of the first differential transistor circuit 11. Equation (11) indicates that transfer conductances Gm1 and Gm2 are nearly equal when VE>>VT. If VE is smaller, for instance, if VE is three times as large as VT, transfer conductance Gm1 is much larger than Gm1. Consequently, the side-effects produced in the invention will be greater.

To reduce the side-effects, it is preferred that Ix<<Io. A noise and a direct current offset produced by the second differential transistor circuit 13 will be thus relatively reduced. However, this means that the non-linearity of the transfer characteristic of the second differential transistor circuit 13 becomes greater. An effect of the invention will be reduced as well. A quantitative analysis will be carried out for determining an acceptable range. VX is defined by equation (12) below as a parameter.

$$VX = Ix*RX + VT \qquad (12)$$

Figure 1:
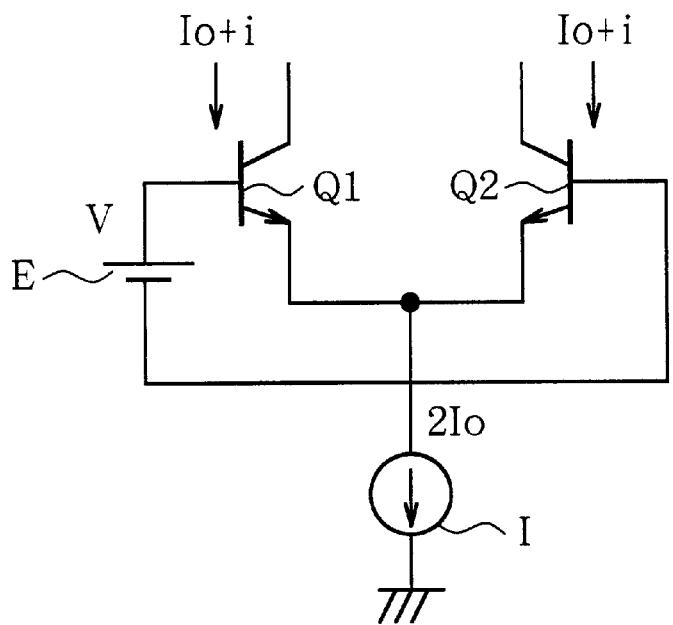
FIG. 1 is a schematic circuit diagram of an example of a differential amplifier circuit of a related art.
Figure 2:
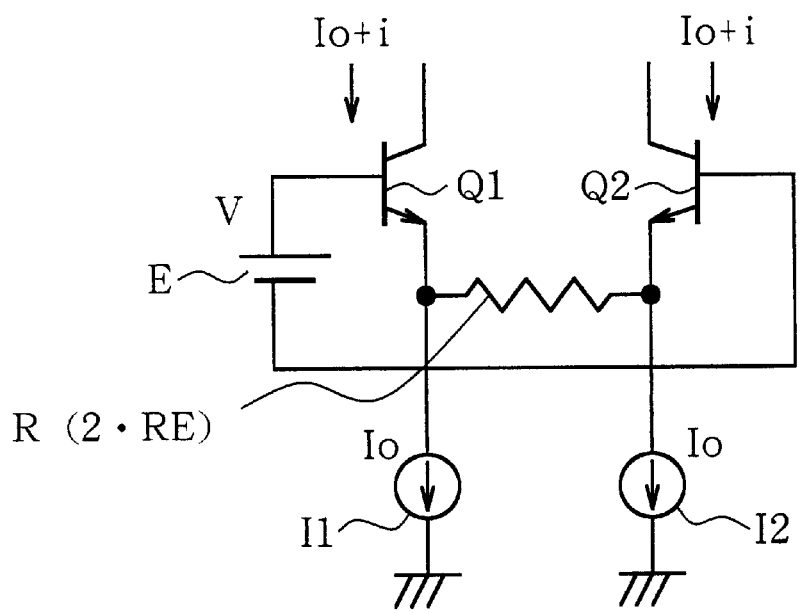
FIG. 2 is a schematic circuit diagram of an example of a differential amplifier circuit of another related art.
Figure 3:
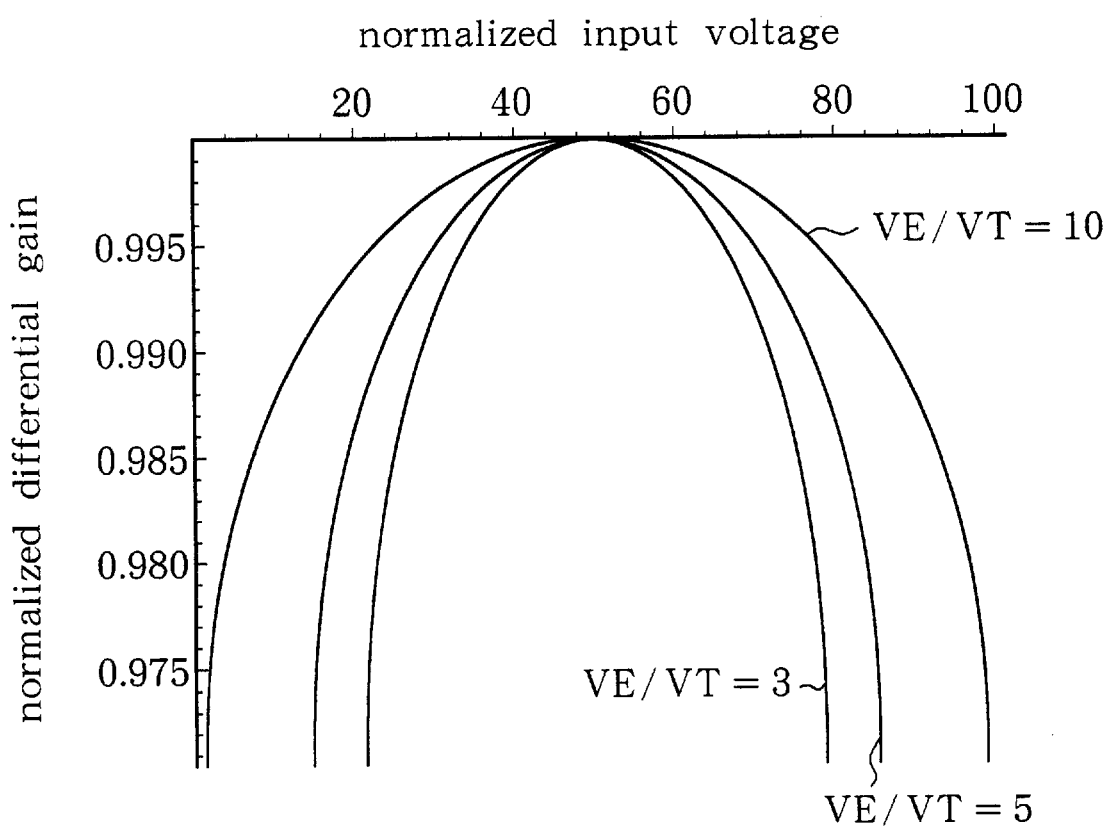
FIG. 3 a plot for describing an operation of the differential amplifier circuit of the related art.
Figure 5:
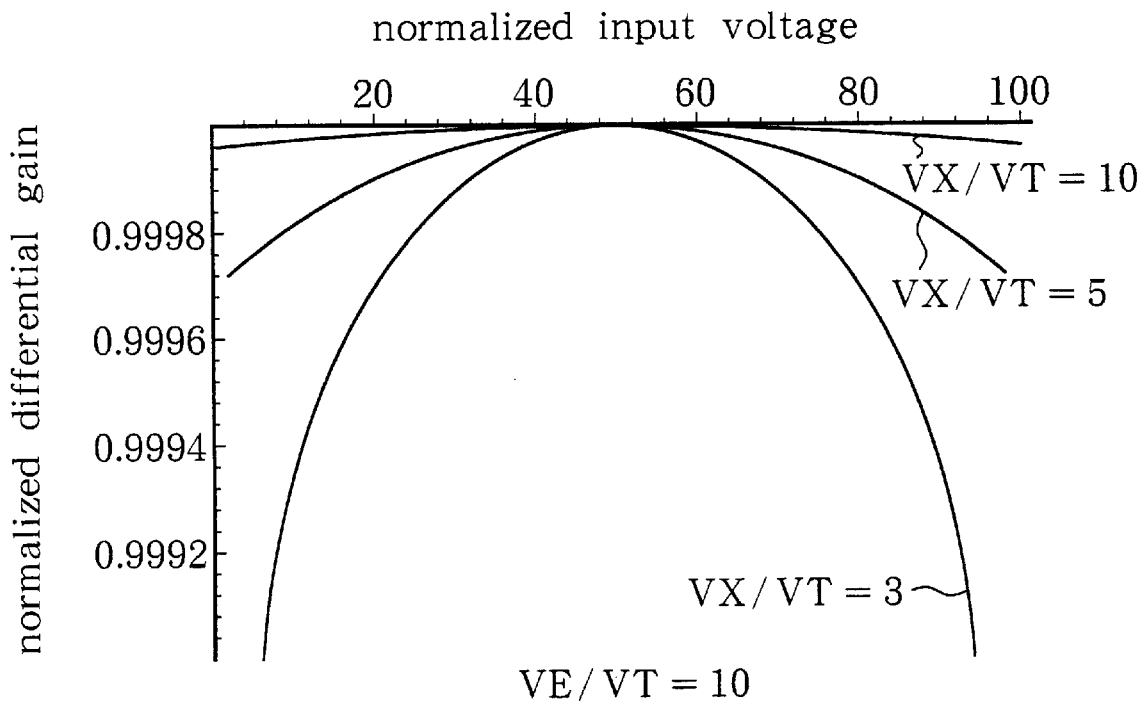
FIG. 5 is a plot for describing an operation of the differential amplifier circuit of the first embodiment of the invention.

FIG. 5 shows normalized differential gains when VE/VT=10 and VX/VT=10, 5 and 3. The horizontal axis is scaled up by 30 times of FIG. 3. It is clear that linearity is greatly improved. Allowing a change in differential gain of the order of 0.1 percent, 90 percent of a normalized input is acceptable when VX/VT=3.

Figure 6:
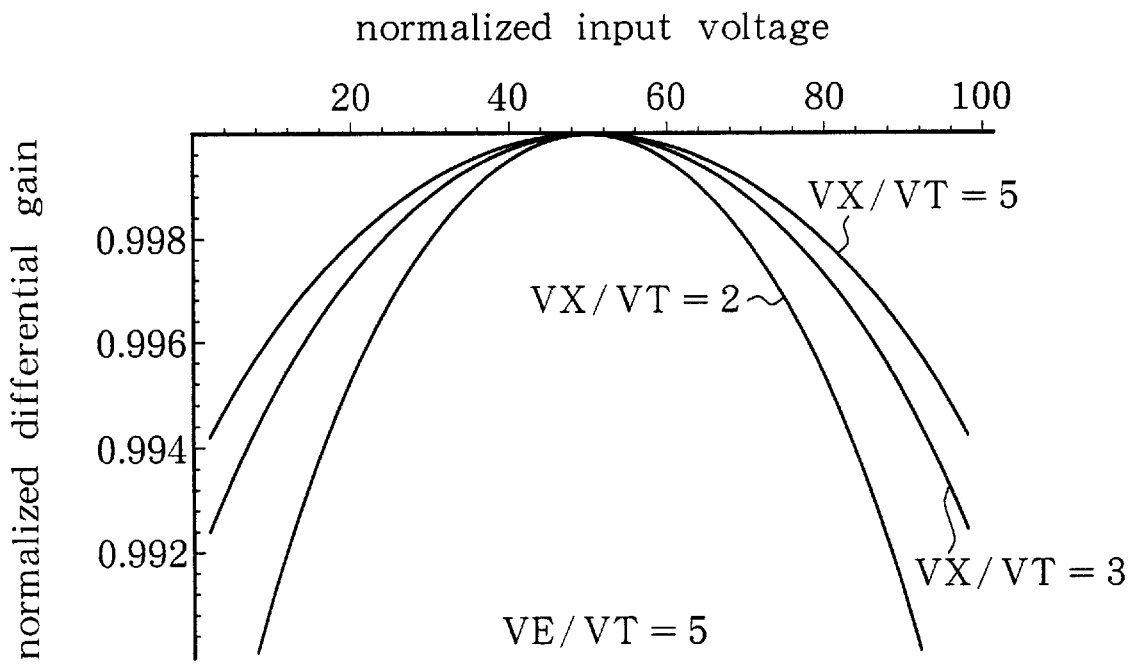
FIG. 6 is a plot for describing an operation of the differential amplifier circuit of the first embodiment of the invention.

FIG. 6 shows normalized differential gains when VE/VT=5 and VX/VT=5, 3 and 2. The horizontal axis is scaled up by 3 times of FIG. 3. Allowing a change in differential gain of the order of 1 percent, VX/VT=2 is acceptable.

It is thus clear that the embodiment of the invention provides very effective cancellation of non-linear components of the transistors Q11 and Q12.

VX that is, Ix may be smaller in contrast to VE, for producing a satisfactory effect. The side-effects such as an increase in noise and direct current offset are negligible.

Figure 7:
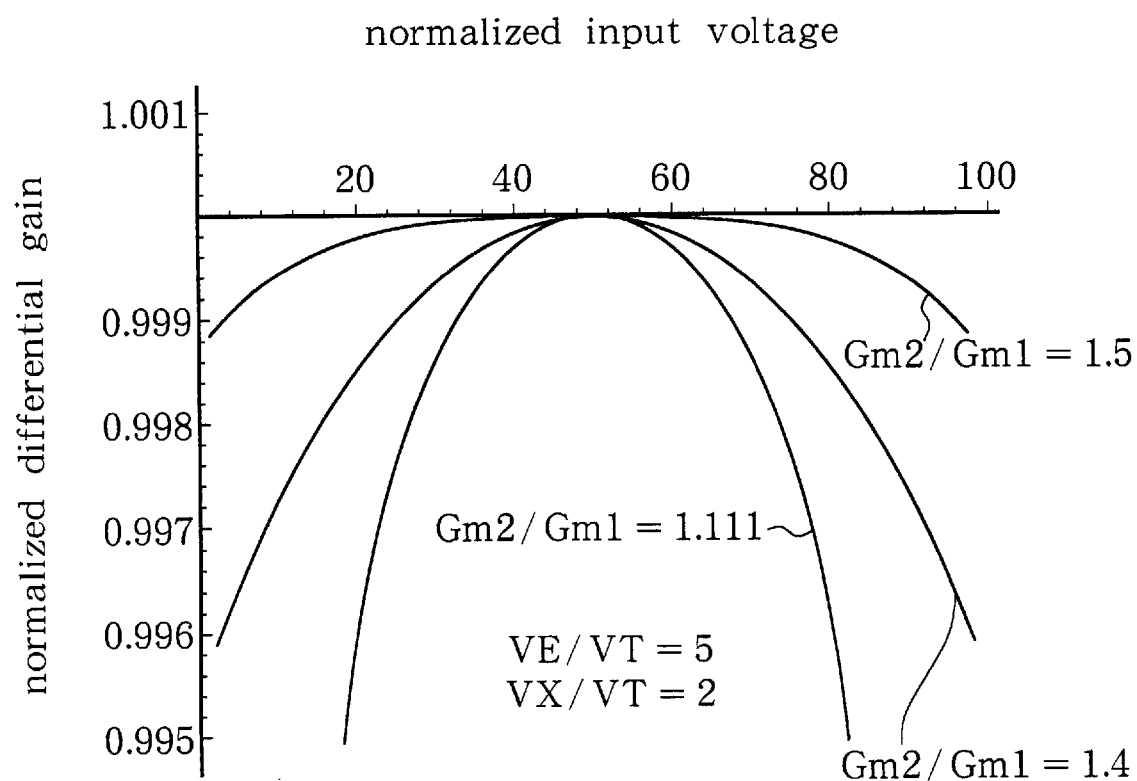
FIG. 7 is a plot for describing an operation of the differential amplifier circuit of the first embodiment of the invention.

Fine adjustment of transfer conductance Gm2 allows a little more improvement in the differential gain characteristic of non-linearity of the second differential transistor circuit 13 shown in FIGS. 5 and 6. An example of the adjustment is shown in FIG. 7 when VE/VT=5 and VX/VT=2.

When a theoretical value for obtaining the cancellation effect is Gm2/Gm1=1.111, the linearity of the transfer characteristic of the differential amplifier circuit is slightly reduced due to the non-linearity of the second differential transistor circuit 13. Larger transfer conductance Gm2 such as 1.4 or 1.5 considerably improves the linearity of the transfer characteristic of the differential amplifier circuit. Non-linearity is negligible even though it is not completely cancelled out where either of the transistors Q11 and Q12 approaches cut-off.

A second embodiment of the invention will now be described. The embodiment provides a double cancellation of non-linear components. That is, the embodiment provides another grounded base transistor circuit and another differential transistor circuit in addition to the differential amplifier circuit of the first embodiment. These circuits cancel out non-linear components produced at the second differential transistor circuit.

Figure 8:
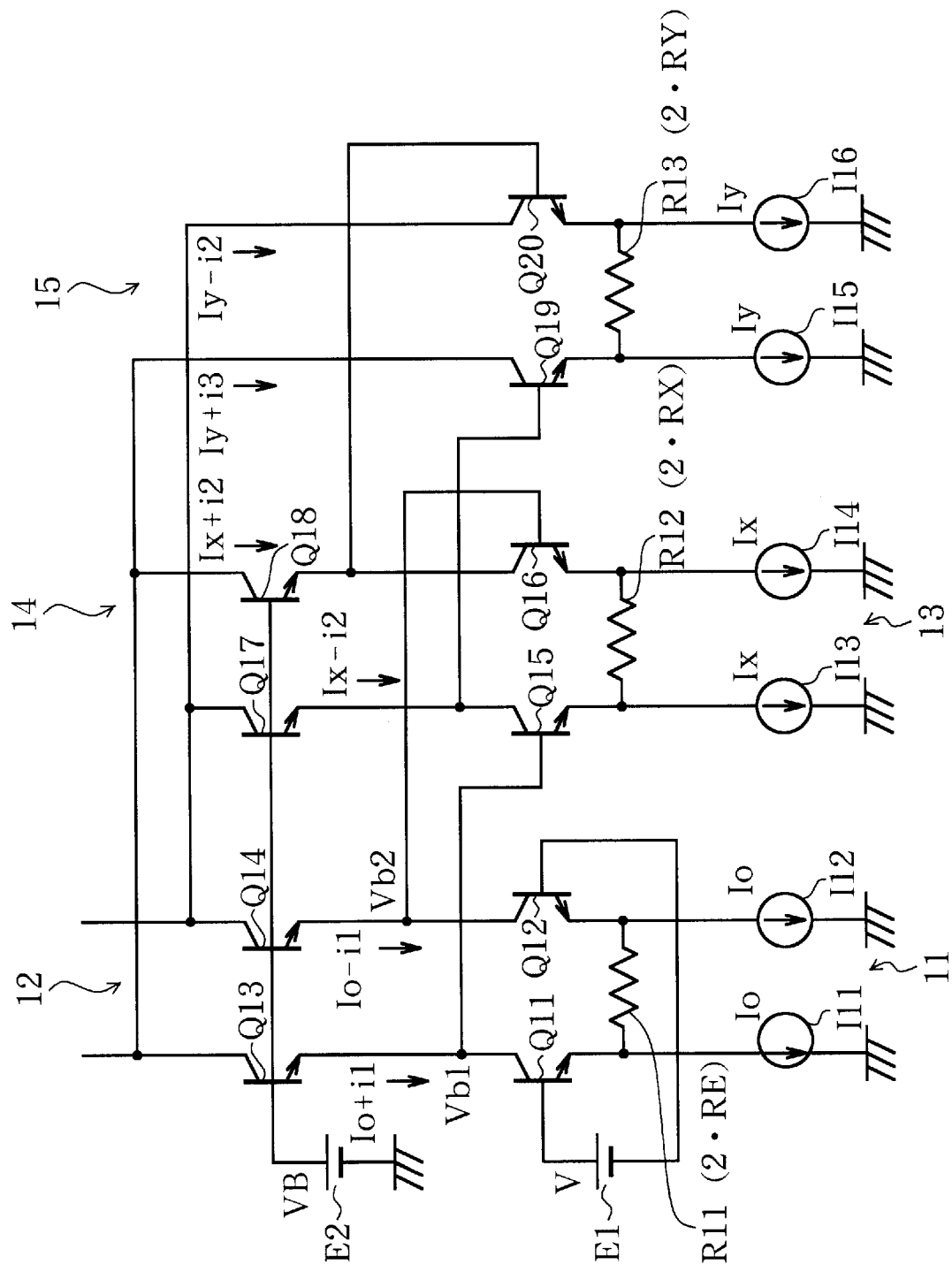
FIG. 8 is a schematic circuit diagram of a differential amplifier circuit of a second embodiment of the invention.

FIG. 8 is a schematic diagram of the differential amplifier circuit of the embodiment. The same numerals are assigned to components having functions similar to those shown in FIG. 4 and detailed descriptions thereof are omitted.

The differential amplifier circuit shown in the figure comprises a second common base transistor circuit 14 and a third differential transistor circuit 15 in addition to the first differential transistor circuit 11, the first common base transistor circuit 12 and the second differential transistor circuit 13.

The second grounded base transistor circuit 14 comprises transistors Q17 and Q18. The third differential transistor circuit 15 comprises transistors Q19 and Q20, emitter feedback resistor R13 and constant-current power supplies I15 and I16.

Emitter electrodes of the transistors Q17 and Q18 of the second common base transistor circuit 14 are each connected to collector electrodes of the transistors Q15 and Q16 of the second differential transistor circuit 13, respectively. Base electrodes of the transistors Q17 and Q18 are connected to the constant-voltage power supply E2. Collector electrodes of the transistors Q17 and Q18 are each cross-connected to collector electrodes of the transistors Q14 and Q13 of the first common base transistor circuit 12, respectively.

Emitter electrodes of the transistors Q19 and Q20 of the third differential transistor circuit 15 are each connected to constant-current power supplies I15 and I16, respectively. Base electrodes of the transistors Q19 and Q20 are each connected to the collector electrodes of the transistors Q15 and Q16 of the second differential transistor circuit 13, respectively. Collector electrodes of the transistors Q19 and Q20 are each cross-connected to collector electrodes of the transistors Q18 and Q17 of the second grounded base transistor circuit 14, respectively. An emitter feedback resistor R13 is connected between the emitter electrodes of the transistors Q19 and Q20. In the figure Iy represents a current fed by the constant-current power supplies I15 and I16. 2RY represents a resistance of the emitter feedback resistor R13.

In the configuration described above, non-linear components of the first differential transistor circuit 11 are cancelled out by the first grounded base transistor circuit 12 and the second differential transistor circuit 13 as the first embodiment. In a similar manner, non-linear components produced at the second differential transistor circuit 13 are cancelled out by the second common base transistor circuit 14 and the third differential transistor circuit 15. Linearity of the second differential transistor circuit 13 is thus improved.

The configuration allows a smaller value for VE/VT and Ix since a degree of linearity required for the second differential transistor circuit 13 is relatively moderate. As a result, the side-effects such as an increase in noise and direct current offset are reduced. The differential amplifier circuit of higher linearity is achieved as well.

Figure 9:
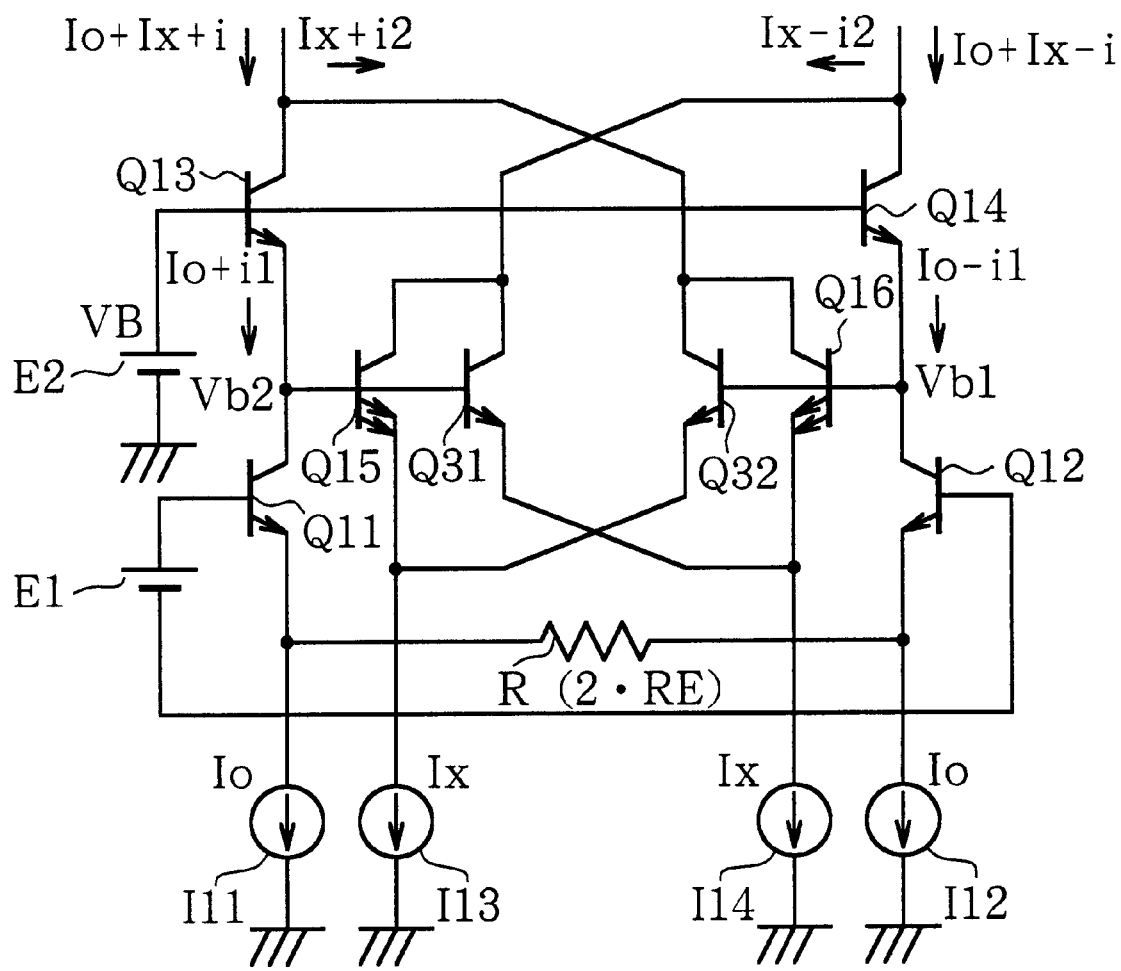
FIG. 9 is a schematic circuit diagram of a differential amplifier circuit of a third embodiment of the invention.

A third embodiment of the invention will now be described. FIG. 9 is a schematic diagram of the embodiment. The same numerals are assigned to components having functions similar to those shown in FIG. 4 and detailed descriptions thereof are omitted.

The embodiment implements the second differential transistor circuit 13 with a circuit including cross-connected two pairs of transistors (transistors Q15 and Q31 and transistors Q16 and Q32) each having an emitter area ratio of N:1 (where N is an integer of 4 or above), instead of a circuit with emitter feedback.

In the figure the transistors Q15 and Q31 and the transistors Q16 and Q32 are the two pairs of transistors each having an emitter area ratio of N:1. Base and collector electrodes of the transistor Q31 are connected in parallel to base and collector electrodes of the transistor Q15. Base and collector electrodes of the transistor Q32 are connected in parallel to base and collector electrodes of the transistor Q16. Emitter electrodes of the transistors Q31 and Q32 are each cross-connected to emitter electrodes of the transistors Q16 and Q15, respectively.

The configuration of the circuit allows a transfer conductance to be reduced near an operating point while a transfer conductance to be increased in a region out of the operating point by designating a large value for N. As a result, VE/VT and Ix are smaller than those in the basic circuit shown in FIG. 4. The side-effects are thus reduced.

Figure 10:
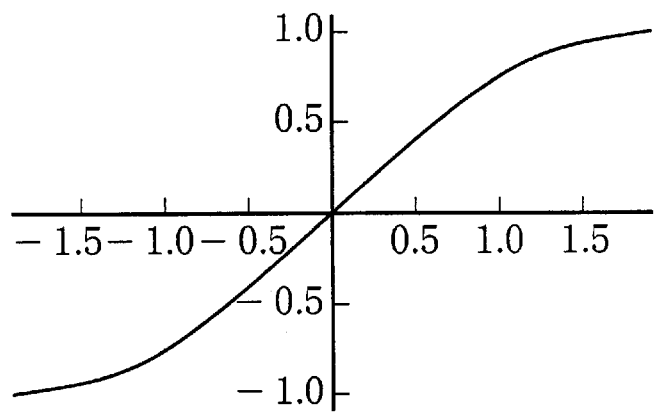
FIGS. 10A, 10B 10C are plots for describing an operation of the differential amplifier circuit of the third embodiment of the invention.
Figure 10:
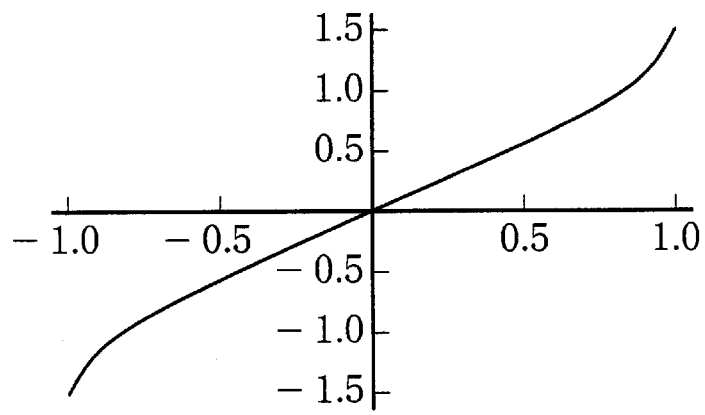
Figure 10:
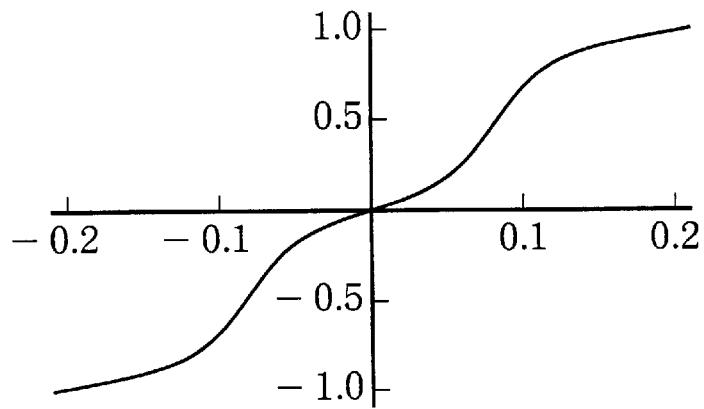

FIGS. 10(a) to 10(c) show the concept thereof. FIG. 10(a) indicates a transfer characteristic of a differential transistor circuit. The characteristic corresponds to a relation between input voltage v and an amount of change (an alternating current component) i1 in a collector current of the transistors Q11 and Q12 in FIG. 4. The scale in the figure is not particularly important. The transfer characteristic has non-linearity in a direction of a peak value of a signal brought into saturation for a great amplitude. In contrast, a voltage applied to the emitters of the transistors Q13 and Q14 has non-linearity in a direction of a peak value extending as shown in FIG. 10(b). The basic concept of the invention is to cancel out the non-linearity by assigning some weight to the emitter voltage to be added to the amount of change i1 in a collector current of the transistors Q11 and Q12.

The third embodiment allows by design non-linearity of the second differential transistor circuit 13 as well. FIG. 10(c) shows an example wherein an emitter area ratio N:1 is 10:1. Non-linearity is obtained for extending a peak value. As a result, not only the emitter voltage of the transistors Q13 and Q14 but also the second differential transistor circuit 13 produces cancellation components. The condition for cancellation is thus satisfied with smaller current Ix.

The emitter area ratio N:1 is at least 4:1 in the embodiment. Otherwise a differential gain near the operating point is not less than a differential gain with a great amplitude.

A fourth embodiment of the invention will now be described. The embodiment is an application of the invention to a multiplier circuit.

Figure 11:
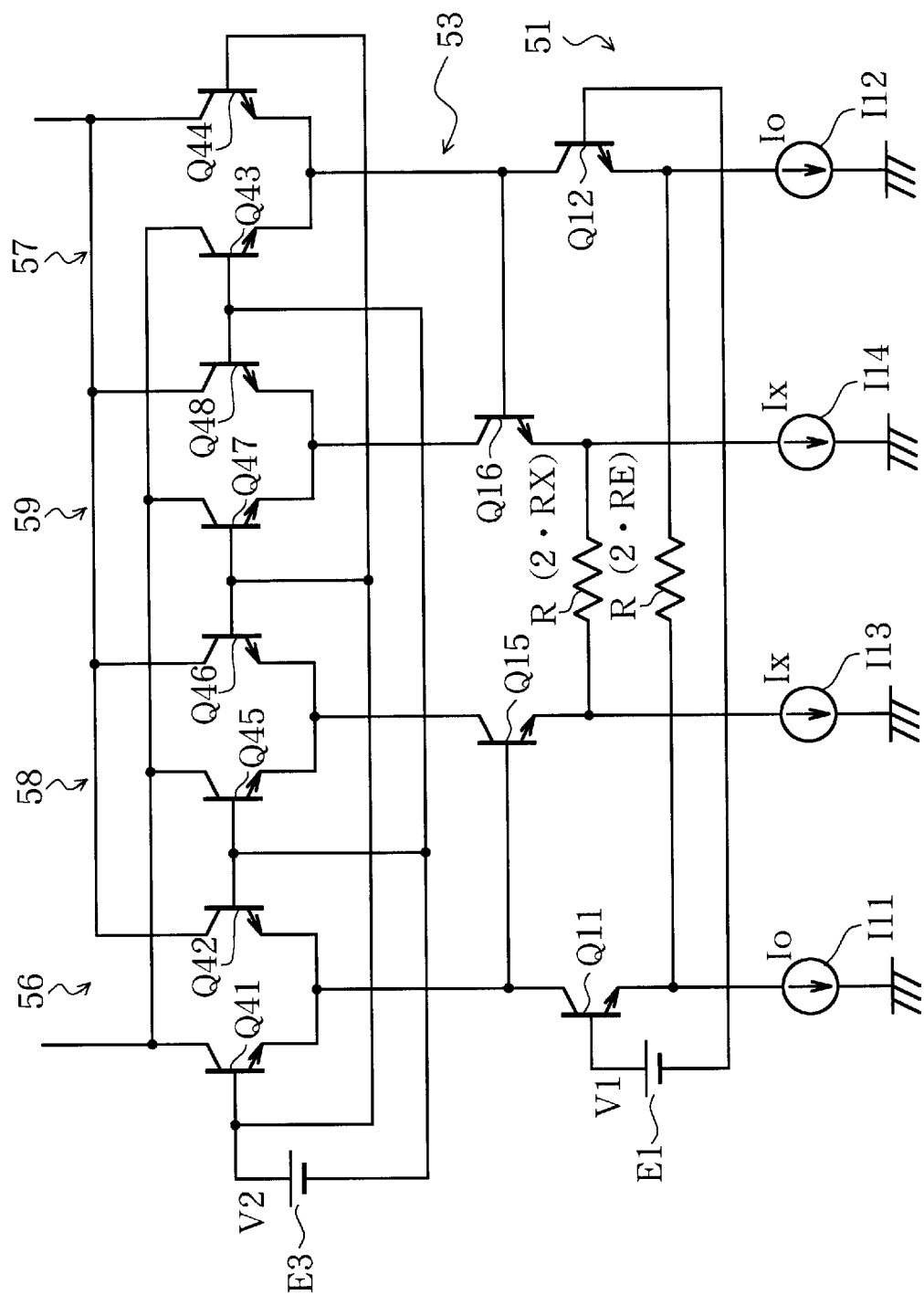
FIG. 11 a schematic circuit diagram of an emitter-coupled differential amplifier circuit of a fourth embodiment of the invention.

FIG. 11 is a schematic diagram of the embodiment. The same numerals are assigned to components having functions similar to those shown in FIG. 4 and detailed descriptions thereof are omitted.

In FIG. 11 the grounded base transistor circuit 12 in FIG. 4 is replaced with third and fourth differential transistor circuits 56 and 57 as a current diverting circuit for multiplication. Therefore a voltage applied to the emitters does not change with any input voltage v2. In FIG. 11 seventh and eighth differential transistor circuits 58 and 59 as a current diverting circuit are added to a second differential transistor circuit 53 for cancelling non-linear components of a first differential transistor circuit 51 as well.

The third differential transistor circuit 56 comprises transistors Q41 and Q42. The fourth differential transistor circuit 57 comprises transistors Q43 and Q44. The seventh differential transistor circuit 58 comprises transistors Q45 and Q46. The eighth differential transistor circuit 59 comprises transistors Q47 and Q48.

Emitter electrodes of the transistors Q41 and Q42 are connected to a collector electrode of the transistor Q11.

Emitter electrodes of the transistors Q43 and Q44 are connected to a collector electrode of the transistor Q12. Emitter electrodes of the transistors Q45 and Q46 are connected to a collector electrode of the transistor Q15. Emitter electrodes of the transistors Q47 and Q48 are connected to a collector electrode of the transistor Q16.

Base electrodes of the transistors Q41, Q44, Q46 and Q47 are connected to a positive terminal of input voltage source E3. Base electrodes of the transistors Q42, Q43, Q45 and Q48 are connected to a negative terminal of input voltage source E3. Collector electrodes of the transistors Q41, Q43, Q45 and Q47 are connected to a first power supply not shown. Collector electrodes of the transistors Q42, Q44, Q46 and Q48 are connected to a second power supply not shown.

In the configuration described above, input voltage v1 outputted from the input voltage source E1 is multiplied by input voltage v2 outputted from the input voltage source E3. A result is outputted from the collector electrodes of the transistors Q41, Q43, Q45 and Q47 and the collector electrodes of the transistors Q42, Q44, Q46 and Q48.

Features of the circuit include two stages of transistors for every current path and a considerably low voltage operation. It is also noted that the non-linearity cancellation circuit does not sacrifice a minimum operation voltage.

The present invention is not limited to the four embodiments described so far but may be practiced in still other ways within the scope of the invention.

As described so far, the differential amplifier circuit of the invention includes the base grounded circuit and the second differential transistor circuit, in addition to the first differential transistor circuit, for generating a current for cancelling non-linear components produced at the first differential transistor circuit. The current is cross-added to alternating current components of the first differential transistor circuit. As a result, linearity of a transfer characteristic of the differential amplifier circuit dramatically improves without sacrificing a noise characteristic, a gain, a current consumption and so on.

In prior art technology, linearity of a transfer characteristic is achieved by obtaining a required dynamic range with a larger emitter feedback, sacrificing a noise characteristic, a gain, a current consumption and so on to some extent. In contrast the differential amplifier circuit of the invention achieves a higher degree of linearity in an almost full range of the dynamic range. Consequently, improvements are expected in a noise characteristic, a gain, a current consumption and so on.

The differential amplifier circuit of the invention may be implemented with the second differential transistor circuit with the cross-connected two pairs of transistors of an emitter area ratio of 4:1 or above, instead of a circuit with an emitter feedback The side-effects produced by addition of the second differential transistor circuit such as degradation of a noise characteristic are thus eliminated.

The other differential amplifier circuit of the invention is implemented with an addition of the grounded base transistor circuit and the differential transistor circuit for cancelling non-linear components produced at the second differential transistor circuit. A degree of linearity required for the second differential transistor circuit is thus moderate. As a result, the side-effects such as an increase in noise and direct current offset are reduced. Linearity is improved as well.

The still other differential amplifier circuit of the invention is implemented with the differential transistor circuit as a current diverting circuit, instead of the grounded base transistor circuit. Higher linearity and a low-noise characteristic are thus achieved. A multiplier circuit is implemented, particularly ideal for a gain control circuit and a modulator-demodulator circuit for radio communications requiring a wide dynamic range.

What is claimed is:

1. A differential amplifier circuit comprising:

a first differential transistor circuit having first and second transistors wherein an input voltage is applied between base electrodes of said first and second transistors and an emitter feedback resistor is connected between emitter electrodes of said first and second transistors;

a common base transistor circuit having third and fourth transistors, wherein a collector current of each of said first and second transistors is supplied to an emitter electrode of each of said third and fourth transistors, respectively, and wherein bases of said third and fourth transistors are connected to each other; and a second differential transistor circuit having fifth and sixth transistors, wherein an emitter electrode voltage of each of said third and fourth transistors is applied to a base electrode of each of said fifth and sixth transistors and a collector current of each of said fifth and sixth transistors is cross-added to a collector current of each of said fourth and third transistors, respectively.

2. A differential amplifier circuit according to claim 1 wherein said second differential transistor circuit has an emitter feedback resistor connected between emitter electrodes of said fifth and sixth transistors.

3. A differential amplifier circuit according to claim 1, wherein said second differential transistor has seventh and eighth transistors, a base electrode and a collector electrode of each of said seventh and eighth transistors are connected to the base electrode and collector electrode of each of said fifth and sixth transistors, respectively in parallel cross connections are established between an emitter electrode of each of said seventh and eighth transistor and an emitter electrode of each of said sixth and fifth transistors with a current supplied to each of the connections, and wherein a saturation current of each of said seventh and eighth transistors is at least a fourth or less of a saturation current of said sixth and fifth transistors.

4. A differential amplifier circuit comprising:

a first differential transistor circuit having first and second transistors wherein an input voltage is applied to a base electrode of each of said first and second transistors and an emitter feedback resistor is connected between emitter electrodes of said first and second transistors;

a first common base transistor circuit having third and fourth transistors wherein a collector current of each of said first and second transistors is supplied to an emitter electrode of each of said third and fourth transistors, respectively, and wherein bases of said third and fourth transistors are connected to each other;

a second differential transistor circuit having fifth and sixth transistors wherein an emitter electrode voltage of each of said third and fourth transistors is supplied to a base electrode of each of said fifth and sixth transistors and an emitter feedback resistor is inserted between emitter electrodes of said fifth and sixth transistors;

a second common base transistor circuit having seventh and eighth transistors wherein a collector current of each of said fifth and sixth transistors is supplied to an emitter electrode of each of said seventh and eighth transistors and a collector electrode of each of said seventh and eighth transistors is cross-connected to a collector electrode of each of said fourth and third transistors, and wherein bases of said fifth and sixth transistors are connected to each other; and a third differential transistor circuit having ninth and tenth transistors wherein an emitter electrode voltage of each of said seventh and eighth transistors is supplied to a base electrode of each of said ninth and tenth transistors and a collector electrode of each of said ninth and tenth transistors is cross-connected to a collector electrode of each of said eighth and seventh transistors.

5. A differential amplifier circuit comprising:

a first differential transistor circuit having first and second transistors wherein a first input voltage is applied between base electrodes of said first and second transistors and an emitter feedback resistor is connected between emitter electrodes of said first and second transistors;

a second differential transistor circuit having third and fourth transistors;

a third differential transistor circuit having fifth and sixth transistors wherein a second input voltage is applied between base electrodes of said fifth and sixth transistors and a collector of each of said fifth and sixth transistors is connected to a collector of said first transistor;

a fourth differential transistor circuit having seventh and eighth transistors wherein said second input voltage is applied between base electrodes of said seventh and eighth transistors and a collector of each of said seventh and eighth transistors is connected to a collector of said second transistor;

a fifth differential transistor circuit having ninth and tenth transistors wherein said second input voltage is applied between base electrodes of said ninth and tenth transistors and a collector of each of said ninth and tenth transistors is connected to a collector of said third transistor; and a sixth differential transistor circuit having eleventh and twelfth transistors wherein said second input voltage is applied between base electrodes of said eleventh and twelfth transistors and a collector of each of said eleventh and twelfth transistors is connected to a collector of said fourth transistor; wherein an output of a product of said first and second input voltages is obtained from the collectors of said fifth to twelfth transistors.

\* \* \* \* \*